United States Patent
Keigler et al.

(10) Patent No.: US 11,942,341 B2
(45) Date of Patent: Mar. 26, 2024

(54) ADAPTIVE FOCUSING AND TRANSPORT SYSTEM FOR ELECTROPLATING

(71) Applicant: ASMPT NEXX, INC., Billerica, MA (US)

(72) Inventors: Arthur Keigler, Billerica, MA (US); David G. Guarnaccia, Billerica, MA (US); Freeman Fisher, Billerica, MA (US); Demetrius Papapanayiotou, Billerica, MA (US); Jonathan Haynes, Billerica, MA (US); Daniel L. Goodman, Billerica, MA (US)

(73) Assignee: ASMPT NEXX, INC., Billerica, MA (US)

( * ) Notice: Subject to any disclaimer, the term of this patent is extended or adjusted under 35 U.S.C. 154(b) by 5 days.

(21) Appl. No.: 17/584,852

(22) Filed: Jan. 26, 2022

(65) Prior Publication Data

US 2022/0148891 A1    May 12, 2022

(51) Int. Cl.
*H01L 21/67*    (2006.01)
*H01L 21/68*    (2006.01)

(52) U.S. Cl.
CPC .... *H01L 21/6723* (2013.01); *H01L 21/67259* (2013.01); *H01L 21/681* (2013.01)

(58) Field of Classification Search
CPC . H01L 21/6723; H01L 21/682; C25D 17/001; C25D 17/06; C25D 17/08
See application file for complete search history.

(56) References Cited

U.S. PATENT DOCUMENTS

| | | | |
|---|---|---|---|
| 10,023,970 B2 | 7/2018 | He et al. | |
| 2014/0360865 A1* | 12/2014 | Kimura | C25D 17/002 204/198 |
| 2017/0370017 A1 | 12/2017 | Keigler et al. | |
| 2018/0312991 A1 | 11/2018 | Graham et al. | |
| 2019/0181026 A1* | 6/2019 | Yamakawa | B25J 9/1697 |
| 2019/0203373 A1* | 7/2019 | Fujikata | C25D 17/06 |
| 2020/0392641 A1* | 12/2020 | Hirao | C25D 17/02 |
| 2021/0017661 A1* | 1/2021 | Keigler | C25D 17/00 |

* cited by examiner

*Primary Examiner* — Parviz Hassanzadeh
*Assistant Examiner* — Nathan K Ford
(74) *Attorney, Agent, or Firm* — OSTROLENK FABER LLP

(57) ABSTRACT

A system and method for plating a workpiece are described. In one aspect, an apparatus includes a deposition chamber, a workpiece holder adapted for insertion into and removal from the deposition chamber, a shield with patterns of apertures corresponding to features on the workpiece, a shield holder also adapted for insertion into and removal from the deposition chamber and a positioning mechanism to position the workpiece in the workpiece holder such that the pattern of apertures on the shield will align with the corresponding features on the workpiece when the workpiece holder and shield holder are inserted into the deposition chamber.

8 Claims, 20 Drawing Sheets

ADAPTIVE FOCUSING AND TRANSPORT SYSTEM FOR ELECTROPLATING

BACKGROUND AND PRIOR ART

As interconnect critical dimensions tighten, there are a number of applications for which spatial and thickness uniformity of features deposited by electrochemical deposition (ECD) are particularly critical. The uniformity of such features can be improved by the use of close patterning shields (CPS) which focus the electric current to regions of the substrate requiring higher current density.

Large, thin rectangular panels composed of insulating materials are increasingly being used as substrates for advanced packaging applications in electronics. These substrates may be composed of organic laminates or glass which are built up using lithographic processes incorporating electroplating. The substrates range in thickness from extremely thin (100-200 um) to thick (~2 mm) and rigid. Other substrates used in advanced packaging include relatively rigid silicon circular disks as well as more flexible disks fabricated from molding compound or other insulating material. Hereafter, the term "workpiece" will be used to encompass such panels, wafers and substrates suitable for undergoing ECD processes.

FIG. 1 schematically shows a known electrochemical deposition system 100 for depositing metal onto target locations of a workpiece, which is described in detail in US2017/0370017. The electrochemical deposition system 100 includes two or more processing modules, including at least one electrochemical deposition module, arranged on a common platform and configured for depositing one or more metals onto a workpiece. Each electrochemical deposition (ECD) module includes an anode compartment configured to contain a volume of anolyte fluid, a cathode compartment configured to contain a volume of catholyte fluid, and a membrane separating the anode compartment from the cathode compartment. Alternately, the ECD module may comprise a single catholyte cell, for plating metals which do not benefit from separate anolyte and catholyte compartments. The electrochemical deposition system 100 has a loading port to receive a set of workpieces, including a loader module 110 for receiving the workpieces that enter electrochemical deposition system 100 through a load/input stage 112 and loading each received workpiece into a respective workpiece holder 125, such as a flexible panel holder (PH).

System 100 includes a transportation mechanism configured to transport flexible workpieces, via its respective workpiece holder 125, from the loader module 110 to a given processing module, e.g., an electrochemical deposition module, and insert a given workpiece into the given processing module. For example, once a workpiece holder 125, designated for processing, is loaded with a workpiece, it can proceed along a process path 115 (see PH process path) to be pre-processed, as needed, in one or more pre-processing modules 120; processed in one or more processing modules 130, 132, 134, 136, 138; and post-processed, as needed, in one or more post-processing modules 140. Pre-processing may include, for example, cleaning and/or wetting the workpiece to be processed. Processing may include, for example, depositing material, such as metal, onto the workpiece. Post-processing meanwhile may include, for example, rinsing and/or drying the workpiece.

The load/input port 112 portion of system 100, where unprocessed substrates are loaded into workpiece holders, is part of the front end of the system which may also include a front opening unified pod (FOUP—not shown). In single-ended systems, unloading also takes place in the front end of the system. ECD system 100 is double-ended, with unloading at its back end.

An unloader module 150 is configured to remove the flexible workpiece from the workpiece holder and convey the workpiece to an unloading port configured to receive a set of workpieces. Once unloaded, the workpiece holder 125 can return to the loader module 110 along a return path 155 (see PH return path) to receive another workpiece. Multiple workpiece holders can be used, with some workpiece holders held in a storage buffer (not shown).

The electrochemical deposition system 100 further includes a chemical management system 160 for managing processing fluid in the one or more processing cells, i.e. modules 120, 130, 132, 134, 136, 138 or 140. Chemical management may include, but not be limited to, supplying, replenishing, dosing, heating, cooling, circulating, recirculating, storing, monitoring, draining, abating, etc. System 100 also includes an electrical management system 170, which can transmit and receive signals in accordance with computer encoded instructions to control workpiece movement through the electrochemical deposition system 100, or control chemical properties, such as chemical composition, temperature, flow rate(s), etc., of the plural modules 120, 130, 132, 134, 136, 138, 140. Additionally, the electrical management system 170 can be configured to apply an electrical current to one or both opposing planar surfaces of the flexible workpiece when held within the given electrochemical deposition module. In doing so, one or both opposing surfaces can be plated with metal and blind holes and/or through-holes are filled with metal.

Substrates or other workpieces to be processed in such ECD systems may be loaded into workpiece holders and transported to the ECD modules where processing occurs. FIG. 2 shows a known example workpiece holder 125 comprised of flexure contact seal strips 121 and 122 which clamp a workpiece W such that the workpiece is held in a first plane. The workpiece holder 125 also comprises two flexure legs 111 and 113 attached to crossbar 107. The example workpiece holder 125 shown in FIG. 2 is described in detail in U.S. Pat. No. 10,283,396 assigned to the present applicant and incorporated by reference. The workpiece holder 125 is adapted for insertion into and removal from a deposition chamber (such as a processing module 120) while holding the workpiece.

As is understood in the art, dielectric shields with open areas disposed between the anode and the cathode or workpiece are used in ECD to modify globally the electric field near the workpiece, thereby modifying the deposition current for uniformity control, for example to compensate for the terminal effect or other one-dimensional plating effect.

Close patterning shields (CPS), also known as 'current focusing shields', are dielectric shields sufficiently close to the workpiece to allow uniformity control on the length scale of feature patterning. Throughout this document, the terms 'close patterning shield' and 'CPS' are used interchangeably. Close patterning shields are analogous to photomasks in lithography, and contain a pattern of openings designed specifically for use with a particular workpiece pattern. The pattern in a CPS focuses currents to where it is needed on the workpiece, for example in areas where connection features are most densely populated. The connection features are patterns of wires and pads which repeat at the die-scale, so a CPS provides the ability to improve uniformity at the die scale, whereas, in contrast, prior art far uniformity shields (FUS) compensate for current effects at the workpiece scale.

FIG. 3 schematically shows an example CPS 200 in the form of a substantially planar plate having a pattern of apertures formed therein. As shown, CPS 200 contains repeating sets of aperture patterns 220 for use with a rectangular workpiece. Each aperture pattern 220 on CPS 200 corresponds to a single die on the workpiece, so that the aperture patterns 220 are arrayed on CPS 200 similarly to the array of die on the workpiece, i.e. the aperture patterns substantially correspond to target locations of features on the workpiece. Close patterning shields are held by shield holders (not shown in FIG. 3) for alignment with substrates during processing in ECD modules.

FIG. 4 shows an exploded view of an ECD module 503 with a pair of shield holders 320, each shield holder 320 of the pair for positioning a respective CPS 200 in alignment with the workpiece holder 125, the arrangement being such that each shield holder 320 holds its respective CPS 200 in a second plane substantially parallel to the first plane (of the workpiece). Also shown are an ECD module housing 301 and an anode assembly 302. The anode assembly 302 may consist of a set of individually controllable anodes (not shown) connected to a multi-channel power supply via current connections 303. A second anode assembly 302 may be mounted on the back side of housing 301 for electroplating of the reverse side of workpiece W when the workpiece holder 125 is inserted into the ECD module 503. ECD module 503 also has an actuator (not visible in FIG. 4) to set the distance between each CPS 200 and the workpiece W in order to properly focus the electric field between the anode assemblies 302 and the workpiece W. The shield holder 320 is adapted for insertion into and removal from a deposition chamber while holding the CPS 200. The shield holder 320, ECD module 503 and details of actuation of shield holders 320 for close positioning to workpiece holder 125 following insertion into ECD module 503 are described in U.S. patent application Ser. No. 16/516,714 submitted by the present applicant and incorporated by reference.

Careful alignment between close patterning shields and substrates is necessary during processing. The CPS 200 must be held in position so that its apertures 220 align with the corresponding pattern of target locations on the workpiece. In addition, there is an optimum distance between the CPS 200 and the workpiece for proper focusing of the electric field.

FIG. 5 schematically shows an isometric sectional view of the ECD module 503 showing workpiece holder 125 and a shield holder 320 after insertion. An actuator 325 is provided at an internal surface of a housing 301, which is operable to move a cartridge frame 321, translation guide 322, CPS 200 and agitation plate 312 relative to the housing 301, to vary the distance between the CPS 200 and workpiece W. Actuator 325 may for example be of pneumatic, mechanical or electrical type.

FIG. 6 shows the uniformity of the plated heights of connection features for CPS 200 as a function of the gap distance between CPS 200 and workpiece W. Three different CPS curves are shown for various shrink factor (SF) ratios of aperture 220 size relative to feature size on the workpiece W. For this example, the optimum distance between the CPS 200 and the workpiece W is approximately 4-6 mm, depending on the shrink factor chosen. For the optimal shrink factor of 0.7, the optimal distance between the CPS 200 and workpiece W is approximately 4 mm. FIG. 6 shows that the uniformity degrades if the distance from the CPS 200 to the workpiece W is either closer or further than the optimum distance. FIG. 6 also shows an equivalent curve for a far uniformity shield (FUS) employing a regularly spaced aperture pattern. The curves in FIG. 6 suggest that deposition uniformity for a FUS is less sensitive to the distance between the shield and workpiece than for a CPS, but also leads to a larger standard deviation in feature height, i.e. poorer uniformity at the die scale. The FUS is designed to affect uniformity at the workpiece scale, and not the die scale.

Close patterning shields in known ECD tools have been stored outside of the ECD tool and manually installed. It would be preferable to store a variety of shields within an ECD tool and have the desired pattern for a particular workpiece W available upon demand, for insertion into the ECD module without requiring manual intervention. Such a tool configuration would minimize tool down-time and reduce the possibility for installation error.

Close patterning shields in ECD cells must be aligned precisely with respect to their corresponding workpiece pattern in all three dimensions to achieve good deposition uniformity. The alignment of shields to substrates in prior-art tools have not been sufficiently accurate to achieve the level of uniformity needed, especially as the critical dimensions of workpiece features become smaller.

The distance between close patterning shields and workpieces for optimum current focusing is typically set by the distance between the shield holder and the workpiece holder. For this reason, the distance between the surface of the workpiece and the CPS can depend on the workpiece thickness itself. The distance may also depend on the bow of the workpiece once mounted in the workpiece holder. Prior art electroplating systems have not taken into account such workpiece-dependent details in setting the distance between the focusing shield and the workpiece.

The present invention addresses these concerns by providing an automated system which delivers the close patterning shields needed for a particular workpiece to the electrodeposition module prior to processing, and subsequently ensures optimal alignment and spacing between the workpiece and shields during the electrodeposition process.

SUMMARY OF THE INVENTION

In accordance with a first aspect of the present invention there is provided an electrochemical deposition system for depositing metal features onto a workpiece at respective target locations of the workpiece, comprising:
- a deposition chamber adapted to receive plating solution in use,
- a workpiece holder for holding a workpiece in a first plane, the workpiece holder being adapted for insertion into and removal from the deposition chamber while holding the workpiece,
- a shield comprising a substantially planar plate having a pattern of apertures formed therein, the pattern of apertures substantially corresponding to the target locations in use,
- a shield holder for holding the shield in a second plane substantially parallel to the first plane, the shield holder being adapted for insertion into and removal from the deposition chamber while holding the shield, and
- a positioning mechanism for adjusting the position of the workpiece within the first plane, wherein the positioning mechanism is operative to position the workpiece such that the target locations substantially align with the pattern of apertures when the workpiece holder and shield holder are inserted into the deposition chamber.

In accordance with a second aspect of the invention there is provided a method for electrochemical deposition of metal features onto a workpiece at respective target locations of the workpiece, comprising the steps of:
i) providing: a deposition chamber adapted to receive plating solution in use,
a workpiece holder for holding a workpiece in a first plane, the workpiece holder being adapted for insertion into and removal from the deposition chamber, and
a shield comprising a substantially planar plate having a pattern of apertures formed therein, the pattern of apertures substantially corresponding to the target locations in use,
ii) inserting the shield into the deposition chamber,
iii) positioning the workpiece with respect to the workpiece holder within the first plane,
iv) loading the positioned workpiece into the workpiece holder,
v) inserting the loaded workpiece holder into the deposition chamber, and
vi) depositing metal features onto the workpiece,
wherein in step iii), positioning the workpiece with respect to the workpiece holder within the first plane causes the target locations to substantially align with the pattern of apertures when the workpiece holder and shield are inserted into the deposition chamber.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 1:
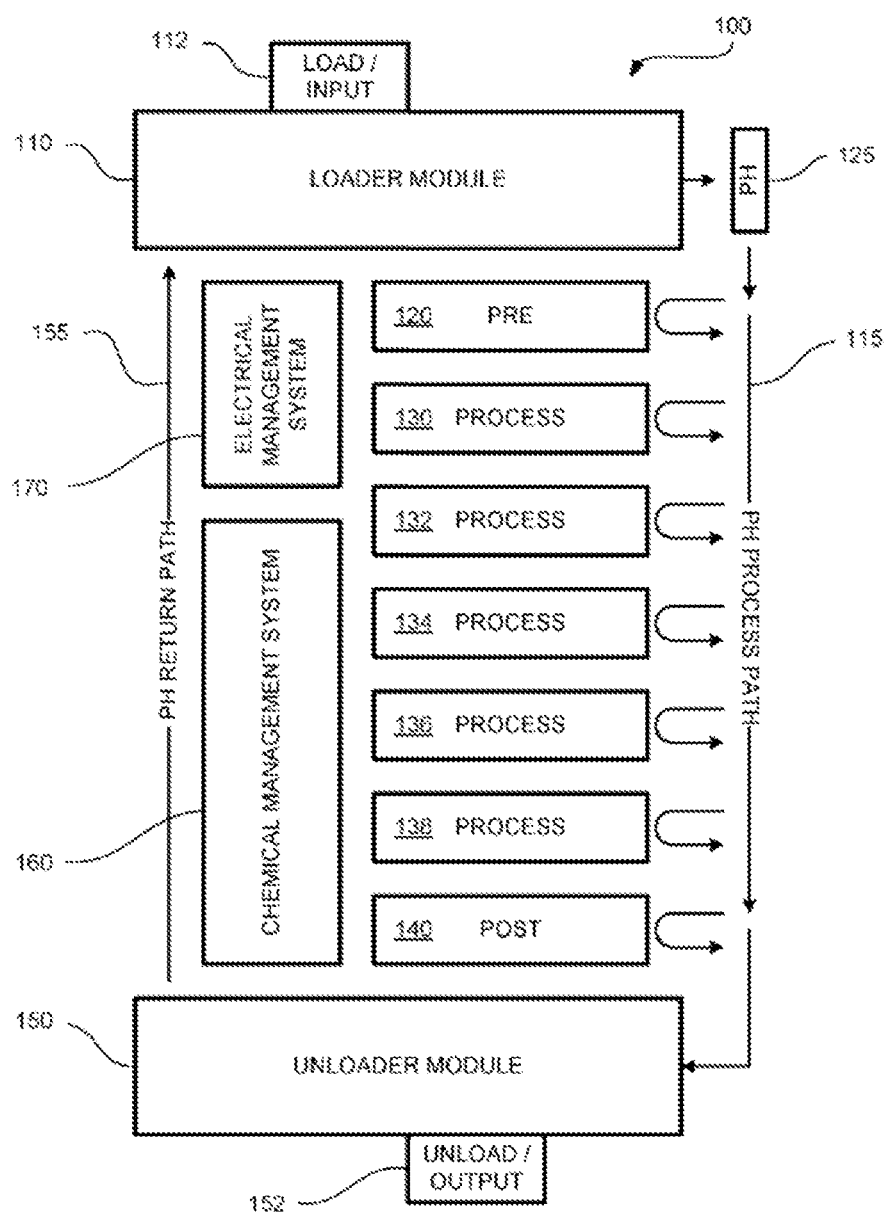
FIG. 1 schematically shows a known electrochemical deposition system.
Figure 2:
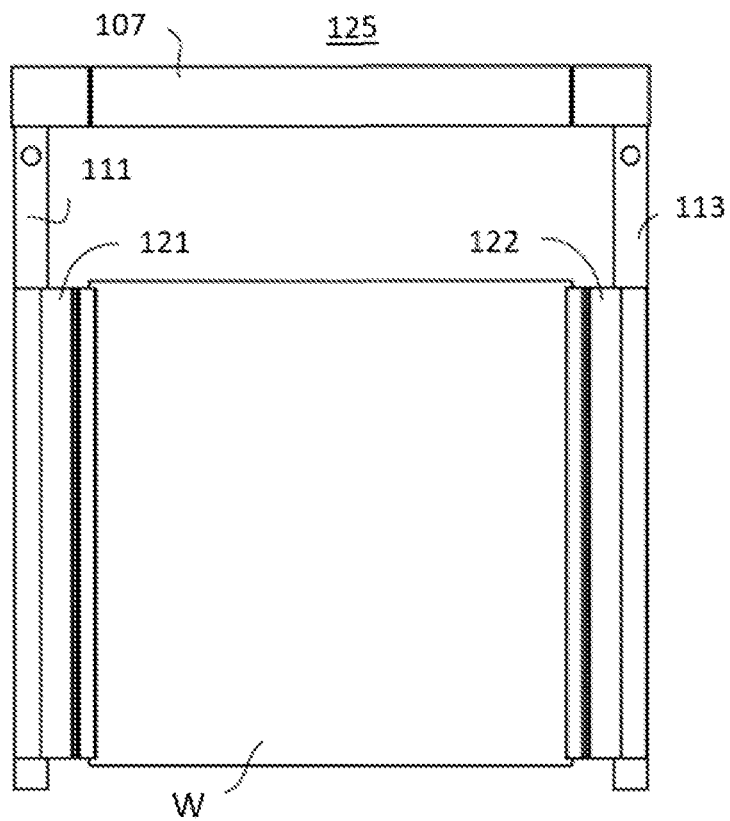
FIG. 2 schematically shows as know workpiece holder.
Figure 3:
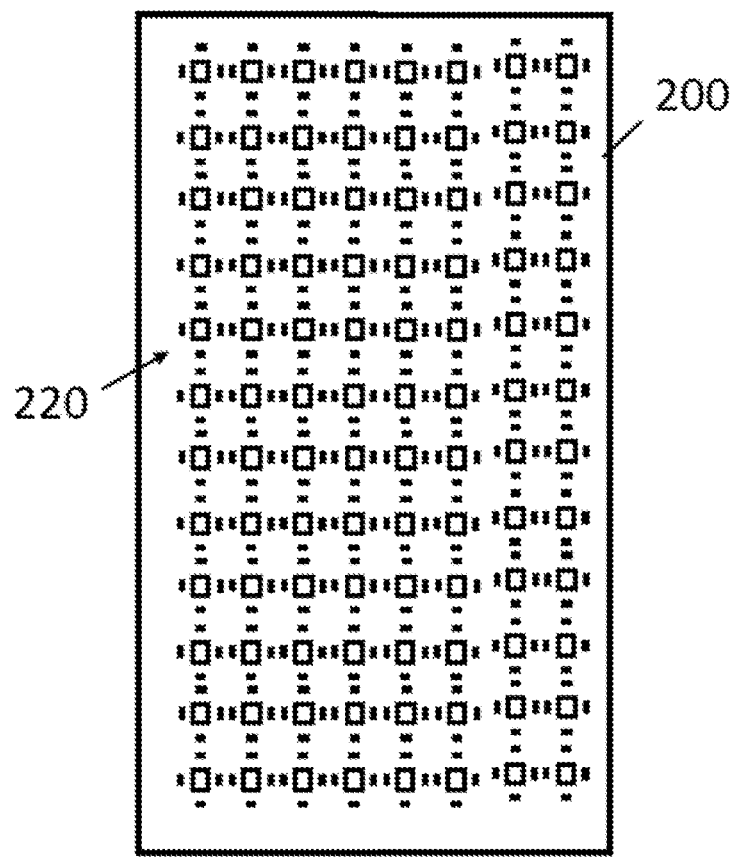
FIG. 3 schematically shows, from above, a known rectangular close patterning shield.
Figure 4:
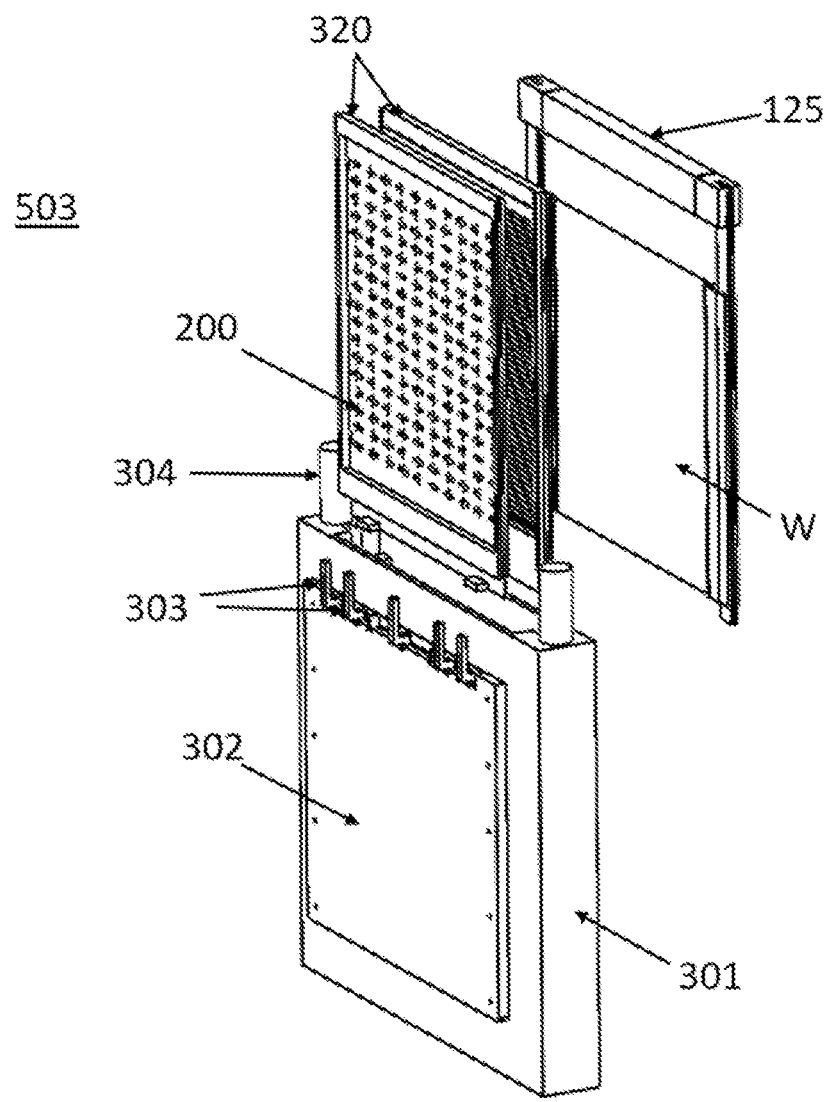
FIG. 4 schematically shows in exploded isometric view a known electrochemical plating module together with a known workpiece holder and two shield holders.

For consistency and clarity, like reference numerals will be retained for like components throughout the following description.

Figure 7:
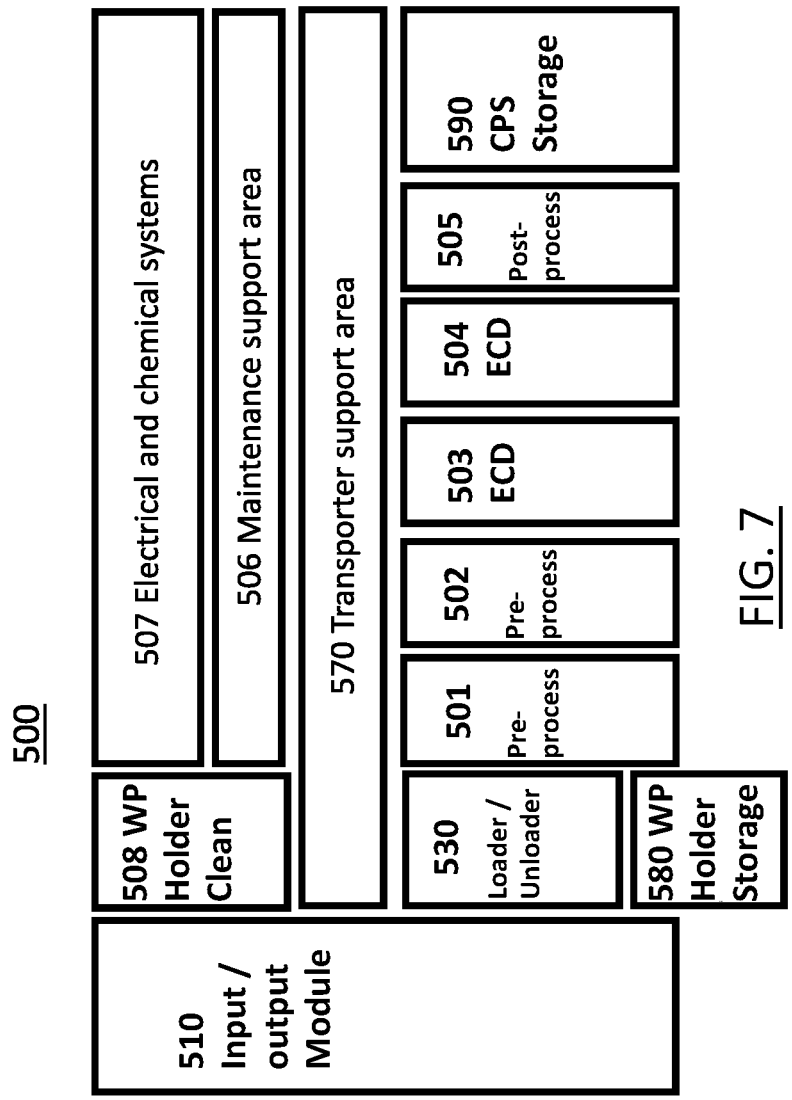
FIG. 7 schematically shows an electrochemical deposition system in accordance with an embodiment of the present invention.

FIG. 7 schematically shows an electroplating tool 500 with an input/output module 510, a loader/unloader module 530, workpiece holder storage module 580, process modules 501-505, close patterning shield storage module 590, transporter support area 570, maintenance support area 506, electrical and chemical systems area 507, and a workpiece holder cleaning module 508. Tool 500 is a single-ended tool with unprocessed substrates introduced into the tool and processed substrates removed from the tool in the same input/output front-end module 510. Although FIG. 7 shows five process modules, tool 500 may have any number of process modules depending on the exact process to be performed, such as the number of different metals to be electroplated, the number of pre- and post-plating processes required and the number of duplicate modules used in parallel to increase tool throughput.

Workpiece holder storage module 580 is used to store workpiece holders 125 when they are not in use. A local transporter (not shown) transfers workpiece holders 125 from storage area 580 to loader/unloader 530 to bring them into service. Transporter support area 570 provides mechanical, electrical and fluid support to two or more transporters 571 (see FIG. 17) which overhang loader/unloader 530, process modules 501-505 and CPS storage area 590. Electrical and chemical systems area 507 house power distribution systems and fluid handling systems for all other modules. Maintenance support area 506 allows support personnel access to equipment in the electrical and chemical systems area 507 and to all electrical and fluid connections in the process modules 501-505. Workpiece holder cleaning module 508 comprises equipment for cleaning the workpiece holders 125 when they are not being used for processing workpieces.

The processing flow for an unprocessed workpiece in tool 500 begins with its transfer, by a robot, from the input/output module 510 to the loader/unloader module 530 where the workpiece W is loaded into a workpiece holder 125. The loaded workpiece holder is then transported using a transportation mechanism to a series of preprocessing modules 501-502 for wet processing steps such as pre-cleaning, pre-rinsing, and chemical activation. The loaded workpiece holder 125 is then transported to either of process modules 503 or 504 for electroplating. After electroplating, the loaded workpiece holder 125 is transported to process module 505 for further processing steps such as final rinsing and drying. Following final rinsing and drying, the loaded workpiece holder 125 is transported to the loader/unloader module 530 where the workpiece W is unloaded from the workpiece holder 125. The processed workpiece W is then transferred to the input/output module 510 for storage until all the workpieces in the current batch have been processed.

Figure 8:
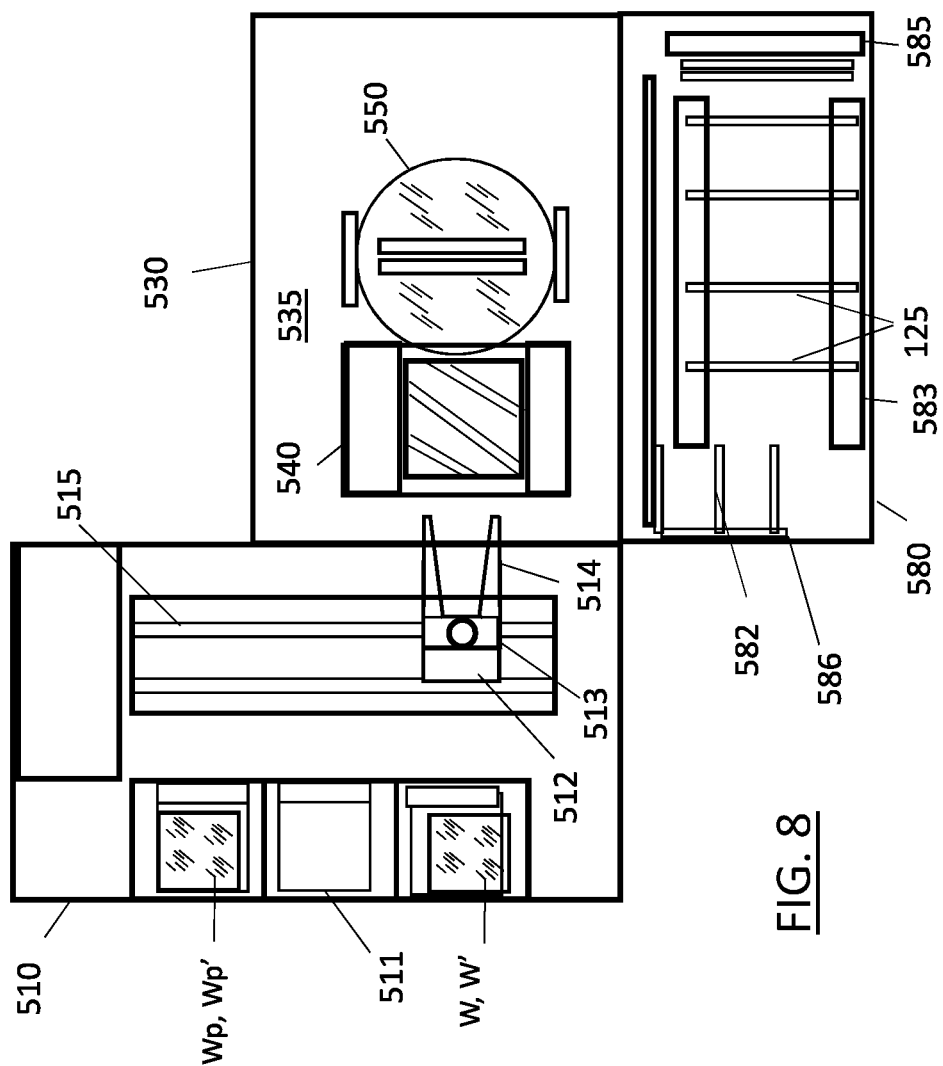
FIG. 8 schematically shows, from above, an input/output module, a loader module and a workpiece holder storage module in accordance with an embodiment of the present invention.

FIG. 8 schematically shows the input/output module 510, loader module 530 and workpiece holder storage module 580. Input/output module 510 comprises at least two front opening unified pods (FOUPs) 511 for storing workpieces, including unprocessed workpieces, such as unprocessed workpieces W and W', and processed workpieces Wp and Wp', with three FOUPs being shown in FIG. 8. The input/output module 510 also includes a robot 512 configured to run along a robotic rail track 515, the robot 512 including an end effector 514 which may rotate about a vertical axis between two rotational orientations, wherein in the first rotational orientation, shown in FIG. 8, the end effector 514 points to the right, and in the second rotational orientation the end effector 514 points to the left. The loader module 530 comprises a loader 535 including a positioning mechanism comprising a positioning stage 540 and a pivot rotate opener or 'PRO' 550, described in more detail below. The workpiece holder storage module 580 comprises a carousel 583 adapted for the temporary storage of a plurality of workpiece holders 125 in an array therein, and a local transporter 586 having a pick-up arm 582 capable of loading workpiece holders 125 from a manual ejector area 585. The local transporter 586 is arranged to transport empty workpiece holders 125 from the carousel 583 to a position where the transporter 571 can transport the workpiece holders 125 to loader/unloader module 530 for insertion into the PRO 550.

The robot 512 is arranged to transfer a single unprocessed workpiece W from the FOUP 511 to the transfer stage 560 (see FIG. 9) provided generally below the positioning stage 540, using the end effector 514 to grab the unprocessed workpiece W from the FOUP 511 while in the second rotational orientation and aligned with the intended FOUP 511 through lateral movement along the robotic rail track 515, rotating to the first rotational orientation and aligning with the transfer stage 560 through lateral movement along the robotic rail track 515 and then depositing it to the transfer stage 560. Similarly, the robot 512 is arranged to return a processed workpiece Wp from the transfer stage 560 to the FOUP 511 after processing, by performing similar operations in reverse. The end effector 514 may for example comprise a lightweight, stiff material such as carbon-fiber composite. As shown, the end effector 514 may comprise mechanical features for gripping the edges of workpiece W. Alternatively, the end effector 514 may comprise other means, such as vacuum cups or Bernoulli gas jets for example, to grip the backside of workpiece W, and hold it flat for subsequent loading operations. Robot 512 may alternatively comprise two end effectors 514 to maximize system throughput when replacing an unprocessed workpiece with a processed workpiece via a so-called 'give-and-get' maneuver, and may be connected to multiple linkages 513 to allow sufficient reach to place workpiece W onto transfer stage 560.

Figure 9:
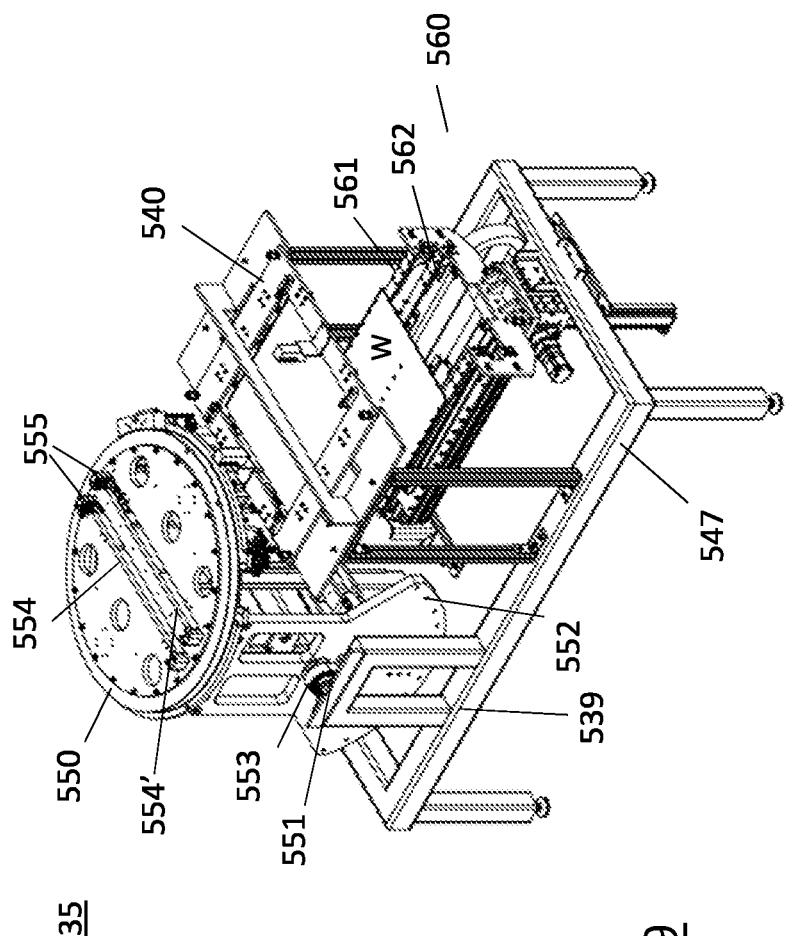
FIG. 9 schematically shows in perspective view a workpiece loader in one configuration in accordance with an embodiment of the present invention.

FIG. 9 schematically shows a perspective view of the workpiece loader 535 comprising PRO 550, positioning stage 540 and workpiece transfer stage 560, all mounted on support frame 539. PRO 550 is disposed in a horizontal position, rotated by pivot arm 552 about axis 551 as actuated by motor drive 553. The upper end of the PRO 550 has two slots 554 and 554' formed therein, the slots 554 and 554' having edge guides 555, the slots 554 and 554' configured to accept respective workpiece holders 125 (not shown in FIG. 9). With PRO 550 in this horizontal position, a workpiece holder 125 may be inserted into slots 554 and 554' from above by transporter 571. The workpiece transfer stage 560 comprises an upper transfer arm 561 and a lower transfer arm 562. Upper transfer arm 561 is shown carrying an unprocessed workpiece W prior to alignment in the positioning stage 540. Transfer stage 560 is shown in a lowered position, used for handoff of workpieces between the input/output module 510 and loader/unloader module 530 via upper transfer arm 561.

Figure 10:
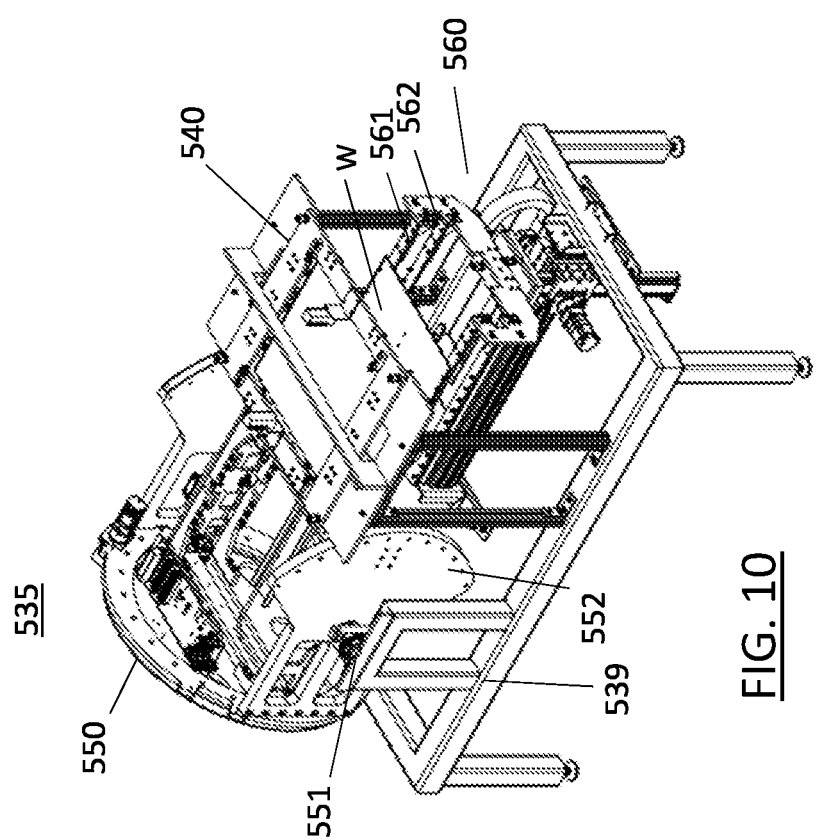
FIG. 10 schematically shows in perspective view a workpiece loader in an alternate configuration in accordance with an embodiment of the present invention.

FIG. 10 schematically shows a perspective view of the workpiece loader 535 in a second configuration with the PRO 550 disposed in a vertical position, i.e. having been rotated by 90° about axis 551 compared to the position shown in FIG. 9. Transfer stage 560 is shown slightly elevated compared to FIG. 9 in a position used for handoff of workpieces between the input/output module 510 and loader/unloader module 530 via lower transfer arm 562. The workpiece holder 125 in slot 554 (not visible in FIG. 10), which is arranged below slot 554' in this position, is now accessible for replacement of processed workpieces by unprocessed workpieces using transfer arms 561 and 562. During transfer of processed workpieces from slot 554 to input/output stage 510 by linkages 513, the PRO 550 is rotated by 180° into an inverse vertical position (not shown in the figures) making the other slot 554' accessible for replacement of processed workpieces with unprocessed workpieces. This sequence of steps is described in more detail below.

Figure 11:
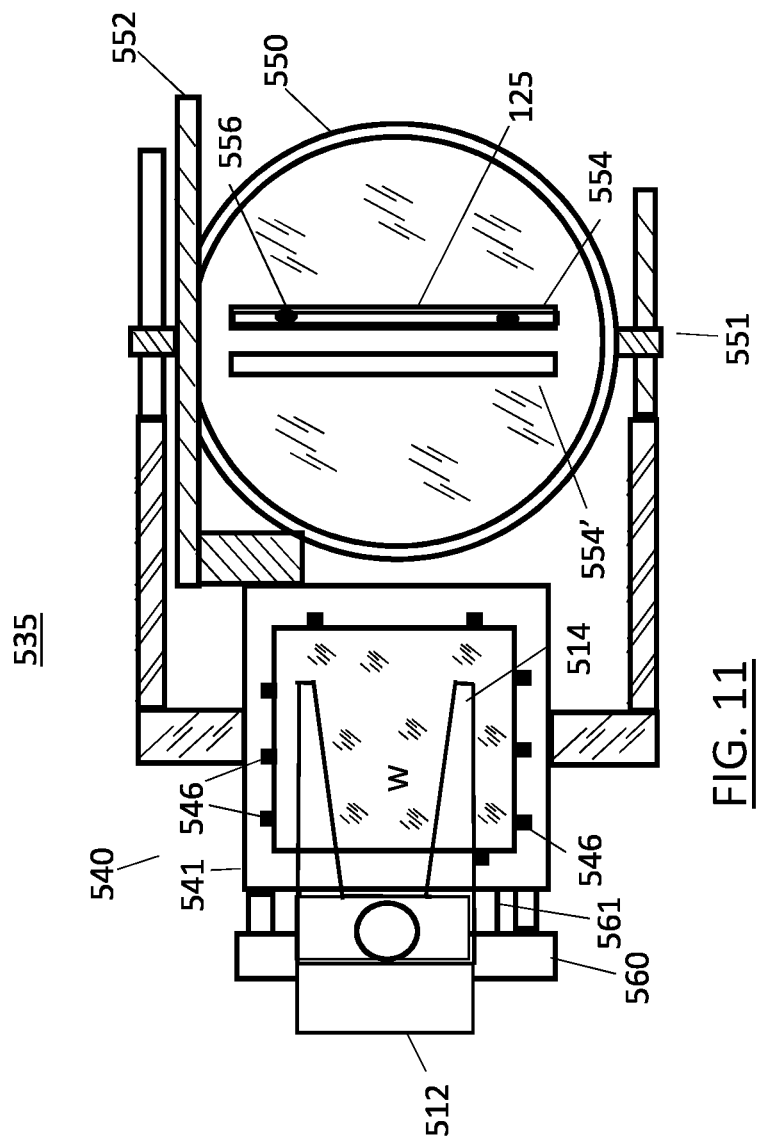
FIG. 11 schematically shows, from above, a workpiece loader in accordance with an embodiment of the present invention.

FIG. 11 schematically shows, from above, the workpiece loader 535 with PRO 550 in a first, horizontal configuration. PRO 550 is shown with a workpiece holder 125 inserted into the slot 554, which as shown is located to the right of slot 554' in this position. The workpiece holder 125 has pickup features 556 which mate with corresponding pickup features (not shown) in transporter 571 to allow the workpiece holder 125 (when loaded with workpiece W) to be lifted from slot 554 and transported to any of the modules 501-505 as required. FIG. 11 also shows the robot 512 with a workpiece W held by the end effector 514 being placed onto transfer arm 561 under positioning stage 540. Following placement into the positioning stage 540 by transfer arm 561, the workpiece W can be accurately positioned with respect to the positioning frame 541 by suitable actuation of the positioning actuators 546 attached to the positioning frame 541.

Figure 5:
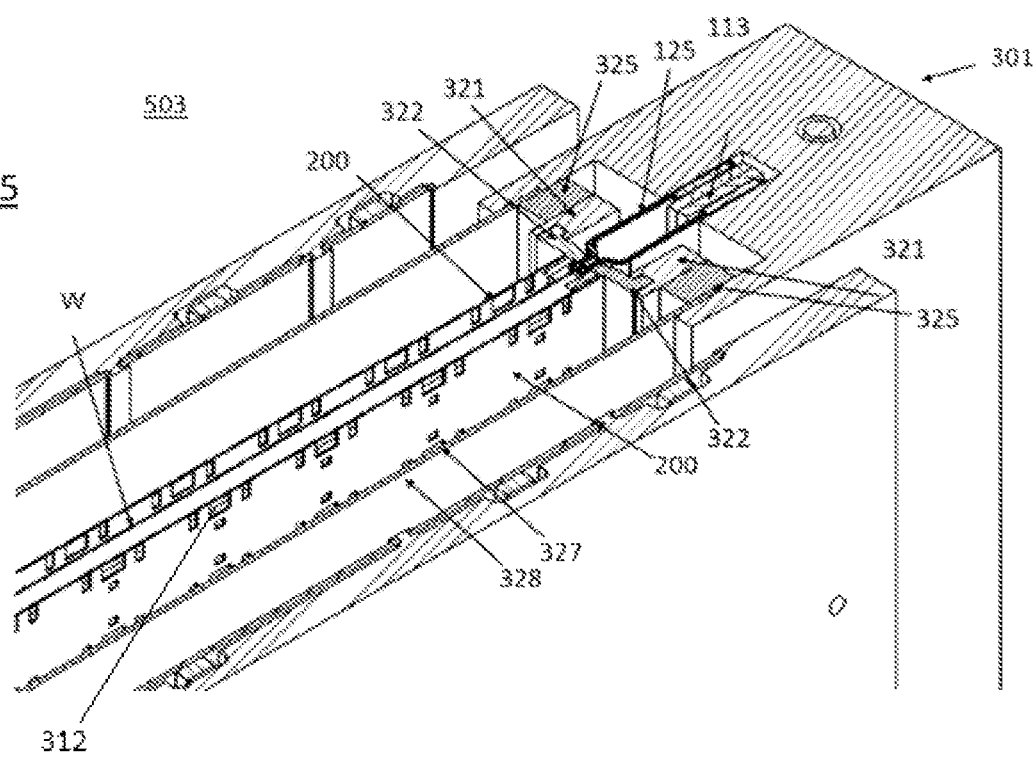
FIG. 5 schematically shows an isometric sectional view of a known electrochemical plating module showing a workpiece holder and shield holder after insertion.
Figure 6:
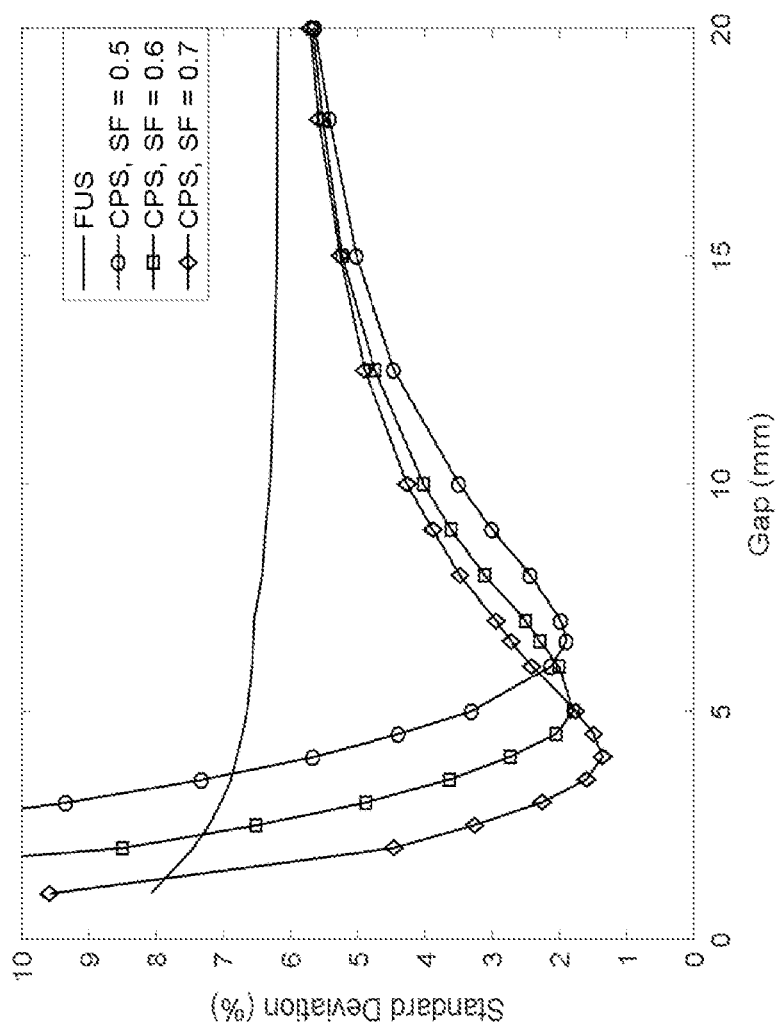
FIG. 6 shows a graph of uniformity versus shield-to-workpiece gap for the rectangular close positioning shield of FIG. 3, and for a far uniformity shield.
Figure 12:
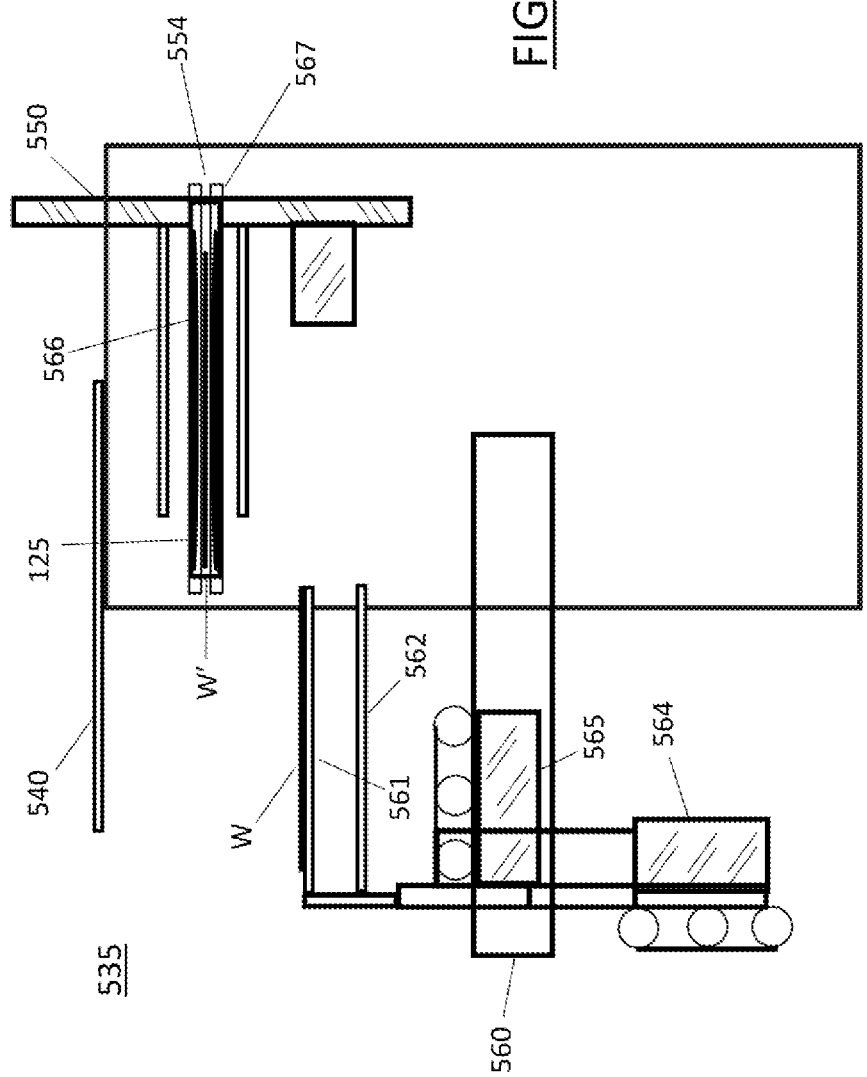
FIG. 12 schematically shows, from the side, a workpiece loader in accordance with an embodiment of the present invention.

FIG. 12 schematically shows, from the side, the workpiece loader 535 with PRO 550 in its second configuration, i.e. in a vertical orientation, with a workpiece holder 125 inserted into a slot 554. An elongated actuation member 567 is attached to the PRO 550 and contains a bladder opener 566 to effect opening of contact seal strips 121, 122 (see FIG. 5) while a workpiece holder 125 is inserted into the slot 554. A suitable actuation member 567 and bladder opener 566 is described in detail in U.S. Pat. No. 10,283,396 assigned to the present applicant and incorporated by reference. PRO 550 requires one bladder opener for each contact seal strip. Workpiece holders 125 adapted for holding one workpiece comprise two contact seal strips, and require two openers 566, whereas workpiece holders 125 which are adapted for holding two workpieces comprise four contact seal strips, and therefore require four openers 566.

Each bladder opener 566 is inflatable to allow both unloading of a processed workpiece Wp by the lower transfer arm 562 and loading of an unprocessed workpiece W by the upper transfer arm 561. As shown, the transfer stage 560 comprises the upper transfer arm 561, shown supporting a workpiece W thereon, the lower transfer arm 562, a vertical drive 564 and a horizontal drive 565. The vertical and horizontal drives 564 and 565 are both motorized, and are respectively operative to position the transfer arms 561 and 562 vertically and horizontally with respect to the positioning stage 540 and workpiece holder 125. Each of the upper transfer arm 561 and lower transfer arm 562 may act to "chuck" a workpiece thereon, i.e. to provide a stable and flat support for the workpiece. Such chucking may be switchable, for example, if vacuum chucking is used, a vacuum supply (not shown) may be switchably connected to each transfer arm 561, 562 along with connections (not shown) to a positive pressure source for optionally floating workpieces on inert gas or compressed dry air during positioning.

Figure 13:
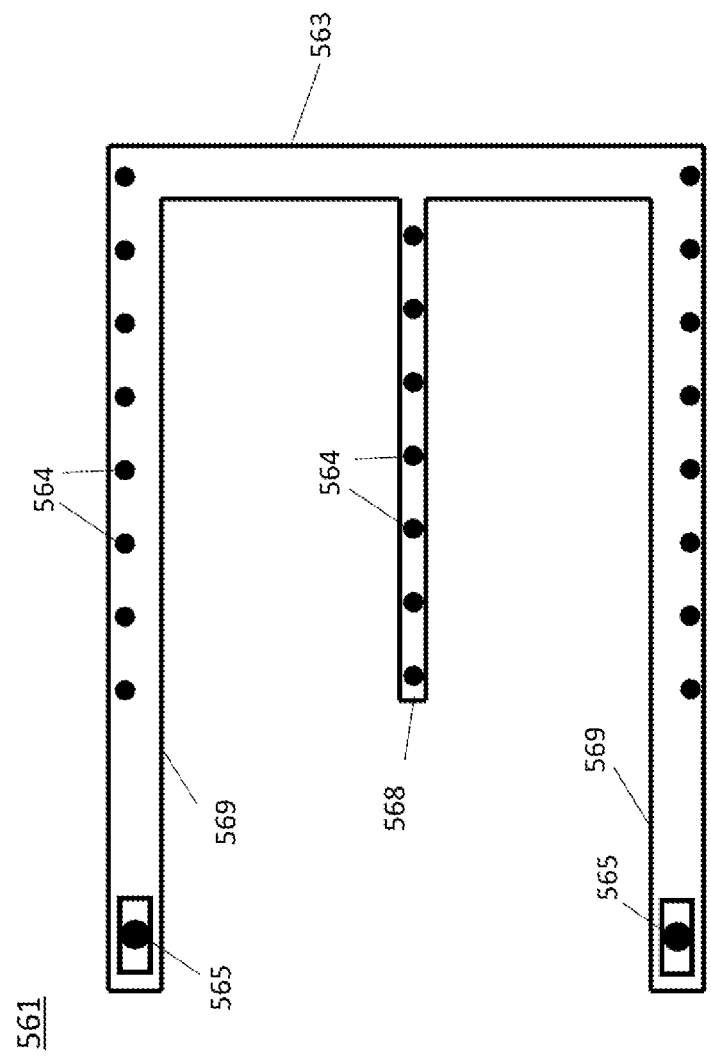
FIG. 13 schematically shows, from above, a transfer arm portion of a workpiece loader in accordance with an embodiment of the present invention.

FIG. 13 schematically shows, from above, upper transfer arm 561 for use within transfer stage 560 for loading workpiece W into holder 125 within PRO 550. Transfer arms 561 and 562 have similar features for gripping a workpiece as the end effector 514, i.e. upper and lower transfer arms 561 and 562 may comprise mechanical features for gripping the edges of workpiece W, or alternatively they may comprise vacuum or suction cups or Bernoulli gas jets to grip the backside of workpiece W, and hold it flat for subsequent loading operations, in particular for loading a workpiece W into a workpiece holder 125.

In the particular embodiment shown in FIG. 13, the upper transfer arm 561 may comprise a frame 563, suction cups 564 and vacuum fittings 565. Frame 563 may for example be fabricated from aluminum, carbon composite or other rigid light-weight material, and as shown comprises first and second parallel outer arms 569, and an inner arm 568 arranged parallel thereto, which is shorter in length than the first and second outer arms 569. Suction cups 564 may have multiple folds and sufficient compliance to allowing vacuum chucking of a workpiece W even with significant bow. The upper transfer arm 561 may also contain separate switchable vacuum connections (not shown) maintaining vacuum on outer arms 569 while having either no pressure or slight positive pressure on inner arm 568.

Figure 14:
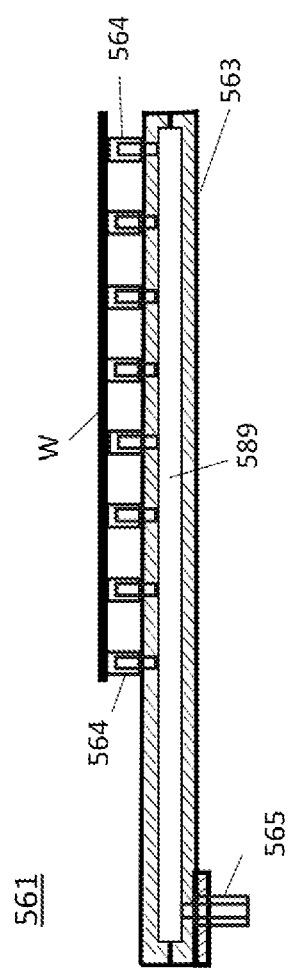
FIG. 14 schematically shows, from the front, a transfer arm portion of a workpiece loader in accordance with an embodiment of the present invention.

FIG. 14 schematically shows, in sectional side view, the upper transfer arm 561, comprising frame 563, suction cups 564 and vacuum fitting 565, with a workpiece W located thereon. The vacuum fitting 565 may be switchably connected to a vacuum supply (not shown) in order to vacuum chuck workpiece W via suction cups 564. The fitting 565 may also be switchably connected to a positive pressure gas supply (not shown) to allow workpiece W to float on a gas cushion during positioning. A cavity 589 is provided within the frame 563 which provides fluid communication between the vacuum fitting 565 and the suction cups 564.

Figure 15:
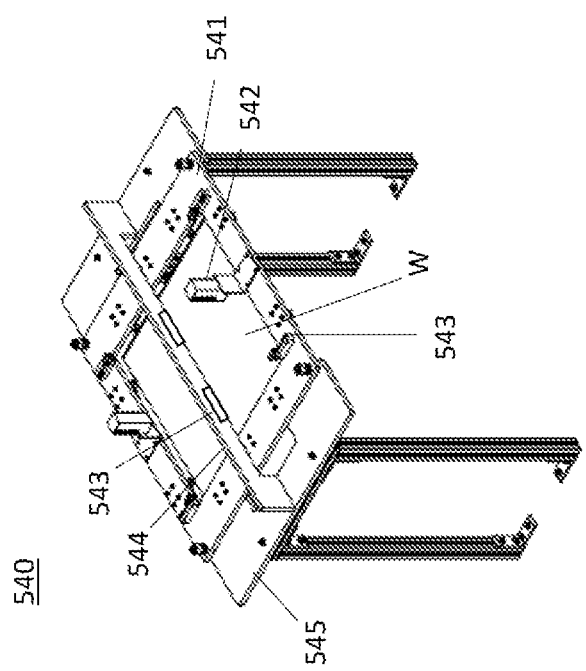
FIG. 15 schematically shows in perspective view, from above, a portion of a workpiece loader in accordance with an embodiment of the present invention.
Figure 16:
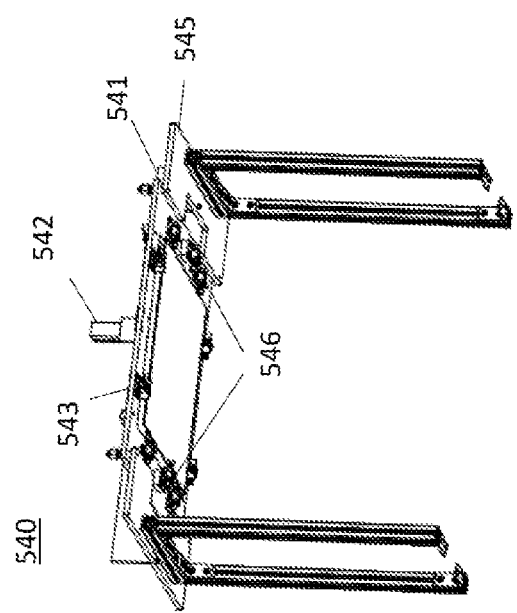
FIG. 16 schematically shows in perspective view, from below, a portion of a workpiece loader in accordance with an embodiment of the present invention.

FIGS. 15 and 16 schematically show, from above and below respectively, the positioning stage 540 in perspective view, including its positioning frame 541 with a workpiece W located therein, while supported by the upper transfer arm 561 (not shown). The positioning stage 540 is supported by a support 545. A sensor cross bar 544 extends across the positioning frame 541 and carries a plurality of ultrasonic positioning sensors 543. A charge-coupled device (CCD) positioning camera 542 is also provided on the positioning frame 541.

The CCD positioning camera 542 is operative to control actuation of the positioning actuators 546 based on observation of fiducial markings (not shown) provided on workpiece W and thus adjust positioning of the workpiece W within the positioning frame 541. The ultrasonic positioning sensors 543 are preferably capable of resolving the distance between the respective sensor 543 and the workpiece W with a resolution of at least 0.3 mm. The plurality of ultrasonic sensors 543 attached to positioning frame 541 may be used to ensure that the workpiece W is both flat and well held by the upper transfer arm 561 prior to its loading into the PRO 550 (see FIG. 12 for example). As shown, two ultrasonic sensors 543 are supported by the sensor cross bar 544, and these may be used to measure the extent of any bowing of the workpiece W. This information may be used to determine the proper position of the CPS shield 200 with respect to the surface of the (potentially bowed) workpiece W in the ECD module 503. Workpiece bow may be measured while workpiece chucking by transfer arm 561 is turned off. Workpiece bow may be measured in a state similar to that in holder 125 by, for example, only chucking workpiece W using suction cups 564 on outer arms 569 (see FIG. 13) while maintaining zero or slight positive pressure on suction cups 564 of center arm 568.

Various commercially available ultrasonic sensors may be suitable for use as the sensors 543, including, by way of example only, the 'UNDK' series of ultrasonic distance measuring sensors available from Baumer Ltd. of Southington, CT The CCD positioning camera 542 is capable of locating fiducial markings and panel edge position with a resolution of 50 um or better. CCD cameras with the necessary resolution include, by way of example only, the 'FLIR' high performance cameras available from Edmunds Optics of Barrington, NJ The positioning actuators 546 are preferably linear stepper motors with positioning accuracy of 50 um or better, such as, by way of example only, the high performance 'G series' of actuators available from Hayden Kerk/Ametek of Waterbury CT.

Figure 17:
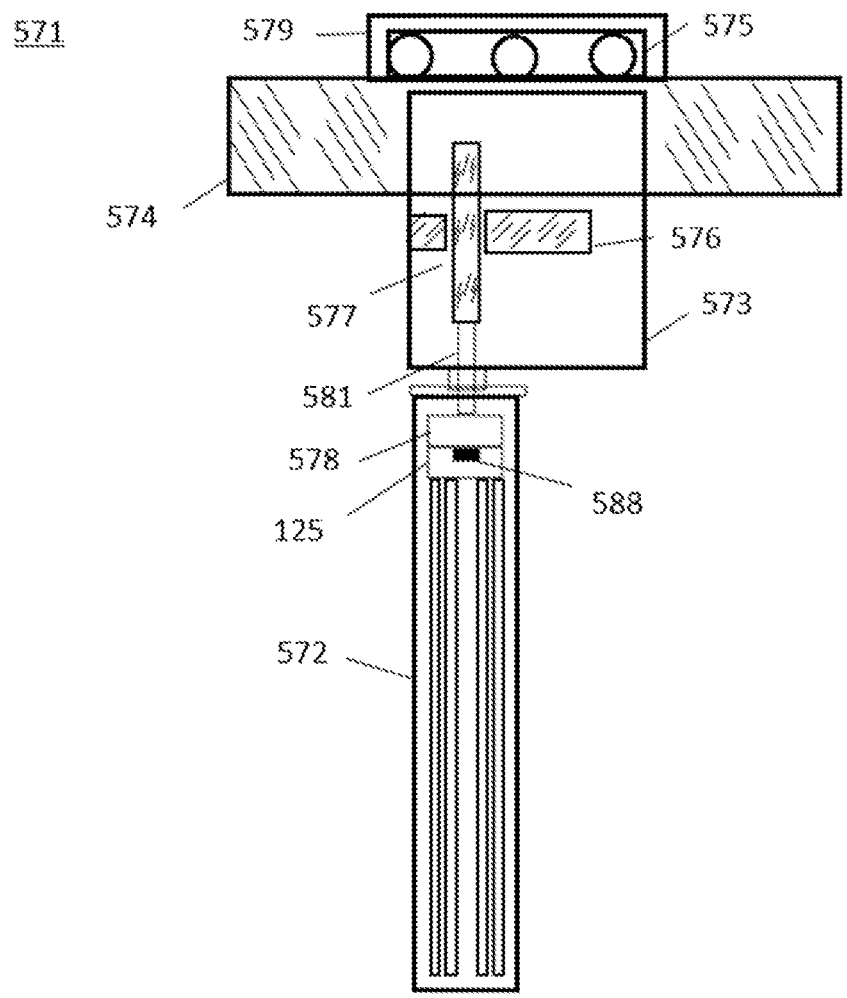
FIG. 17 schematically shows, from the side, a transporter for transporting workpieces and close patterning shield holders in accordance with an embodiment of the present invention.

FIG. 17 schematically shows, from the side, the transporter 571 for transporting workpiece holders 125 one at a time from the loader/unloader module 530 to process modules 501-505, and for transporting shield holders 320 from the shield holder storage module 590 to process modules 501-505. The transporter 571 comprises a wheeled buggy 575, a transporter vertical positioner 573 and an enclosed transporter 572.

The wheeled buggy 575 rides on a transporter rail 574, which extends the length of transporter support area 570, and is driven along the transporter rail 574 by a motor assembly 579. The transporter rail 574 may support several transporters 571, to allow transport of several workpiece holders 125 at a time to increase throughput, or to allow shield holders 320 in ECD module 503 to be changed while simultaneously processing workpieces in process modules 501, 502, 504 and/or 505.

The transporter vertical positioner 573 comprises a coiled belt spool 577 driven by a vertical spooling motor 576. The enclosed transporter 572 comprises a drop-block 578 connected to coiled belt spool 577 by a metal lifting belt 581. The drop-block 578 comprises a lifting clamp 588 which grips pick-up features 556 of workpiece holder 125 when actuated.

Figure 18:
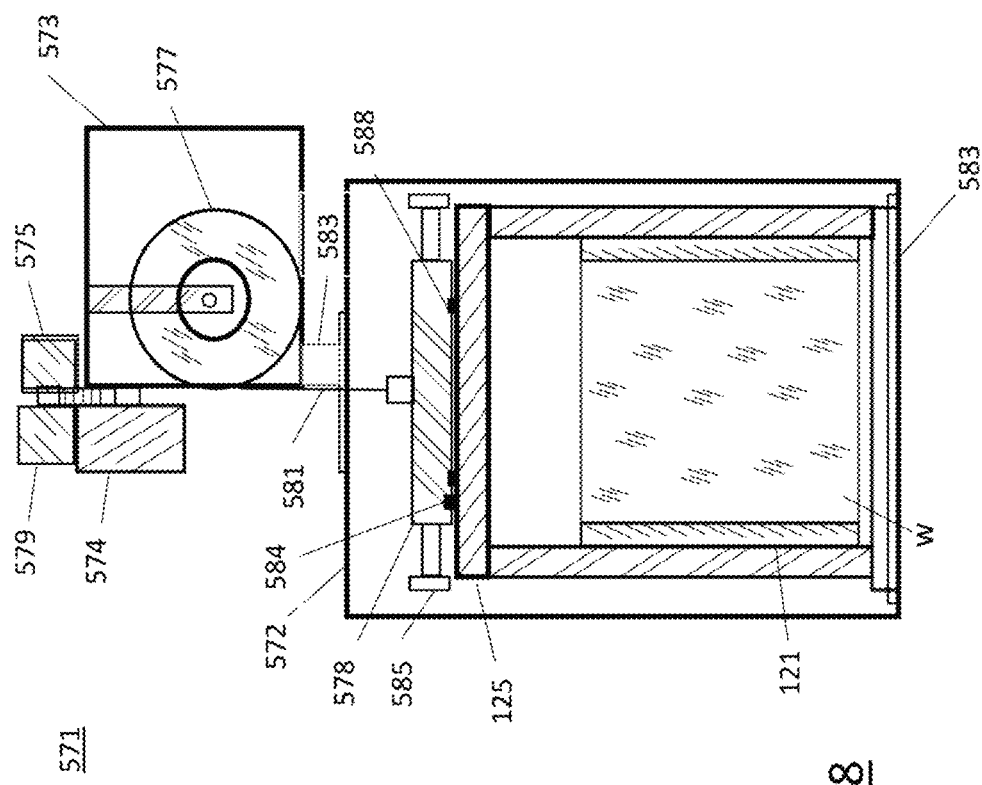
FIG. 18 schematically shows, from the front, a transporter for transporting workpieces and close patterning shield holders in accordance with an embodiment of the present invention.

FIG. 18 schematically shows the transporter 571 viewed from the front. A connector spool 583 attaches the transporter vertical positioner 573 to the enclosed transporter 572 and provides a conduit for electrical cables as well as gas lines, for example to purge the enclosed transporter 572 with nitrogen gas during transport. The enclosed transporter 572 comprises guide features 585 to guide the drop-block 578 during drop-off and pick-up operations, and a lower cover 583, which may be activated to close during transport and to open during drop-off and pick-up. The enclosed transporter 572 may comprise an RFID reader 584 to identify workpiece holders 125 (which typically comprise an RFID tag) and/or shield holders 320 containing RFID tags when removing them from processing modules 501-505 and CPS storage area 590.

Figure 19:
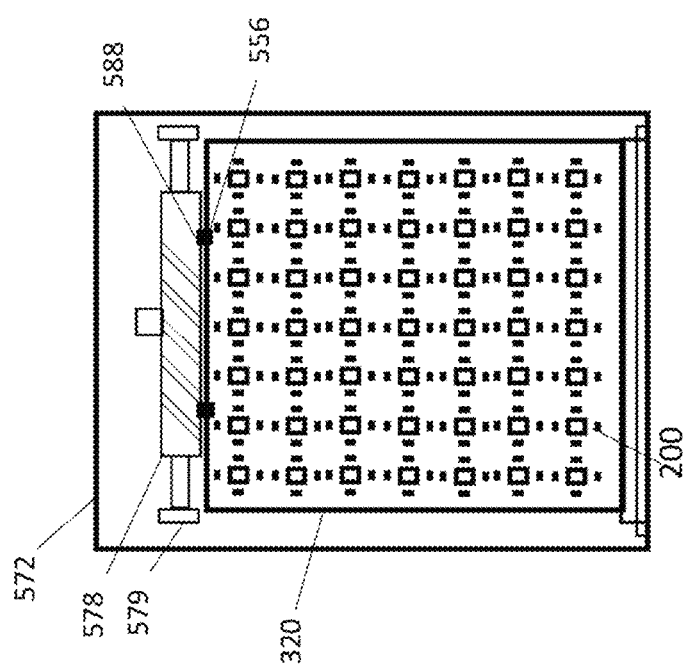
FIG. 19 schematically shows, from the front, an enclosed transporter portion of a transporter for transporting workpieces and close patterning shield holders, in accordance with an embodiment of the present invention.

FIG. 19 schematically shows, from the front, the enclosed transporter 572. The lifting clamp 588 of drop-block 578 grips lifting features 556 of the shield holder 320 for transport from the shield holder storage module 590 to ECD module 503.

Figure 20:
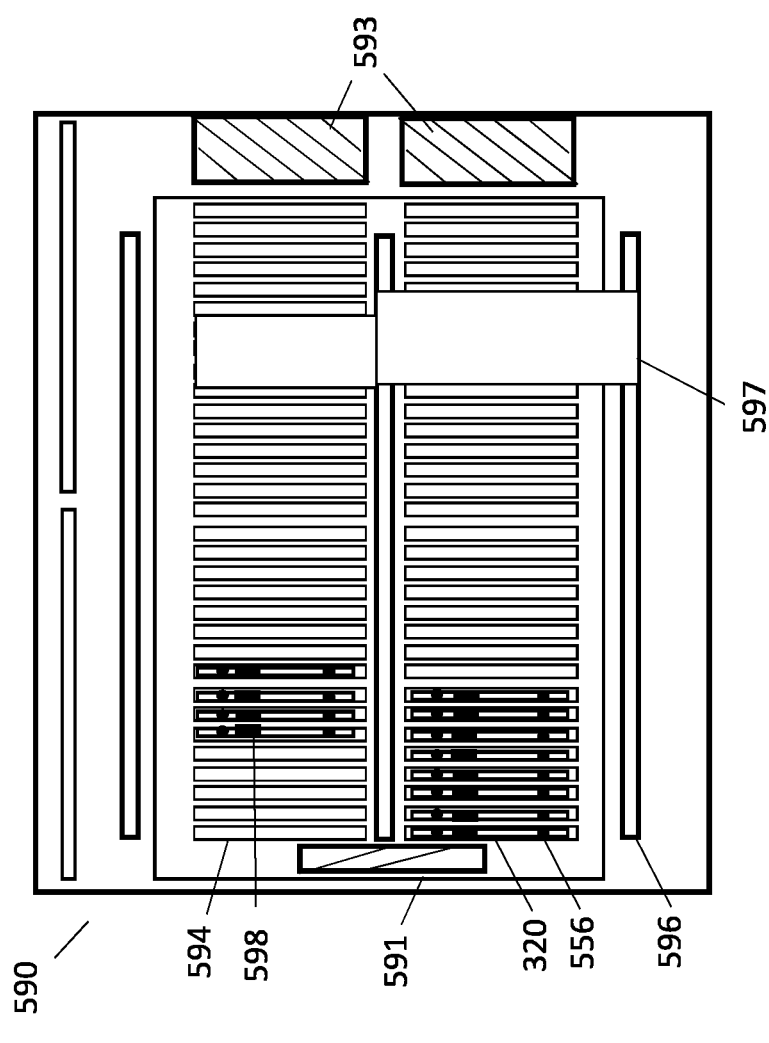
FIG. 20 schematically shows, from above, an electroplating tool storage module for storing close patterning shields in accordance with an embodiment of the present invention.

FIG. 20 schematically shows, from above, the shield storage module 590 for storing a plurality of shield holders 320, each retaining a respective CPS 200, when not in use in process modules 501-505. The shield storage module 590 comprises a plurality of storage bays 594 with features (not shown) to physically support and locate a respective shield holder 320. Shield storage module 590 also comprises an ejector platform 593 for manually loading and unloading shield holders 320 into the shield storage module 590, an overhead transporter 597 supported on transport rails 596 to transport shield holders 320 from the ejector platform 593 to target storage bays 594. The shield storage module 590 also comprises a transporter hand-off platform 591 which interfaces with the overhead transporter 597 for transporting shield holders 320 to and from process modules 501-505. During pick-up of a shield holder 320 by the overhead transporter 597, the identity of the shield holder 320 holding CPS 200 may be verified by reading an RFID tag 598 located within the shield holder 320 using an RFID reader.

Processing Steps

The main processing steps for a method of improving the uniformity of features deposited by electroplating on workpieces, particularly for those for which spatial and thickness uniformity are particularly critical, will now be set out.

Two sets of processing steps are listed, one set for the CPS 200 and a second set for workpieces W and W'. These two sets of processing steps may be asynchronous, i.e. the delivery of workpiece W to the FOUP 511 may occur before, during or after the CPS 200 preparation. Similarly, the transfer of the workpiece W to the transfer stage 560 may occur before, during or after the shield 200 selection and transport, as long as a CPS 200 is present in ECD module 503 during ECD processing of a workpiece 125.

The steps below describe operations for a workpiece holder 125 capable of holding two workpieces W and W' in a workpiece holder 125 comprising four contact seal strips. For workpiece holders 125 configured to hold only a single workpiece W, workpiece process step 5 is not applicable.

CPS Process Steps:
1. Prepare tool with close patterning shields 200: At least two CPS 200, which may include a variety of opening patterns, are loaded into respective associated shield holders 320 and manually stored in respective storage bays 594 using the ejector platform 593 and the overhead transporter 597.
2. Select CPS 200 from list of available CPS in shield storage module 590: A particular CPS 200 is selected because the repeating sets of aperture patterns 220 on that particular shield correspond to target locations of desired plating features on a workpiece W.
3. Transfer CPS 200 from shield storage module 590 to ECD process module 503: The shield holder 320 with its CPS 200 is transferred from its storage bay 594 to transporter hand-off platform 591 using the overhead transporter 597. The identity of CPS 200 may be confirmed by reading RFID tag 598. The shield holder 320 with its CPS 200 is transported to the ECD process module 503 using the transporter 571. The shield holder 320 is inserted into the process module 503 using the drop-block 578. This step may be repeated for a second CPS for plating of a two-sided workpiece or for simultaneous plating of a single side of two workpieces.
4. Return CPS 200 from ECD process module 503 to shield storage module 590: The CPS 200 is transferred to storage module 590 once the operator indicates a different patterning shield is required in ECD module 503. CPS process steps 1-3 are then repeated for a CPS 200 with a different aperture pattern 220.

Workpiece Process Steps:
1. Load unprocessed workpiece W: Robot 513 transfers unprocessed workpiece W from FOUP 511 to upper transfer arm 561 of transfer stage 560 using the end effector 514. Vacuum is applied to suction cups 564 and workpiece W is raised into position within positioning stage 540 to an elevation slightly below frame 541, in vertical alignment with positioning actuator 546.
2. Position workpiece W in workpiece holder 125: Vacuum to ports 565 of upper transfer arm 561 is turned off and a slight positive pressure may be applied, allowing workpiece W to float freely on the suction cups 564 of transfer arm 561. Using images from the CCD positioning camera 542 to monitor fiducial images on workpiece W, positioning actuators 546 position workpiece W on upper transfer arm 561 such that target locations of features on the workpiece W will be in alignment with the corresponding apertures in shield 200 after step 7 below. The data to determine proper position may be based on a computer model of the system, or may be determined experimentally and stored in a database. Following positioning of the workpiece W, suction cups 564 in the outer arm 569 of upper transfer arm 561 are actuated to clamp workpiece W on upper transfer arm 561. The bow of workpiece W may be measured using the ultrasonic sensors 543 and stored in a database prior to applying vacuum to suction cups 564 of central arm 568.
3. PRO 500 is pivoted to the horizontal position to allow access to workpiece holder 125.

Vacuum is applied to ports 565 of lower transfer arm 562 to chuck the workpiece. The bladder openers 555 are actuated to open contact seal strips 121 and 122. The lower transfer arm 562 removes workpiece Wp from workpiece holder 125.

4. Load unprocessed workpiece W into workpiece holder 125: Bladder openers 566 in slot 554 are activated to inflate, opening contact seal strips 121, 122 in workpiece holder 125. Workpiece W is then inserted into opened workpiece holder 125 using the upper transfer arm 561. The bladder openers 566 are then deactivated prior to removing vacuum clamping of workpiece W on upper transfer arm 561, thus ensuring that the workpiece W will be properly positioned when it is inserted in ECD module 503.

5. Repeat Positioning and Loading for unprocessed workpiece W': Robot 513 transfers processed workpiece Wp from lower transfer arm 562 to FOUP 511 using end effector 514. Workpiece Steps 1-4 are then repeated for unprocessed workpiece W' in order to load into the second position of workpiece holder 125.
6. Load second workpiece holder 125': PRO 550 is rotated 180° such the second slot 544' of PRO 550 is accessible for unloading by upper and lower transfer arms 561 and 562. Workpiece steps 1-5 are repeated to unload processed workpieces Wp" and Wp'" and load unprocessed workpieces W" and W'".
7. Transfer workpiece holders 125 and 125' for pre-processing: The PRO 550 is pivoted to its second, horizontal, configuration, and the transporter 571 is operated to pick-up and transport the first workpiece holder 125, including its up-processed workpieces W and W', to pre-process module 501. Transporter 571 then transports second workpiece holder 125' to pre-process module 502.
8. Transfer workpiece holders 125 and 125' for ECD processing: Transporter 571 transports pre-processed workpieces W and W' to ECD module 503. The workpiece holder 125 is then inserted into the ECD process module 503 using the drop-block 578. Transporter 571 then transports preprocessed workpieces W" and W'" to ECD process module 504.
9. Adjust gap between CPS 200 and workpiece W: Using actuator 325, the gap between the CPS 200 and the workpiece W within the workpiece holder 125 in ECD module 503 may be set to a value which optimizes the uniformity of features on workpiece W, while keeping the CPS 200 and workpiece W parallel. The optimal distance may be determined by computer modeling of the focal length of CPS 200 or by experimental methods. The optimal distance may also depend on the thickness of workpiece W and the bow of workpiece W, as measured in step 4 above. The gap for workpieces W', W" and W'" may similarly be set.
10. Deposit metal on the workpiece: Features on the workpieces W, W', W" and W'" are filled with metal using electrochemical deposition.
11. Complete post-processing: Workpiece holders 125 and 125' are transported to post-processing module 505 for rinse and dry operations.
12. Unload processed workpieces: PRO 550 is pivoted to the vertical orientation. Workpiece holders 125 and 125' are transported to loader/unloader section 530 and inserted in slots 554 and 554'. PRO 550 is pivoted to the horizontal orientation to allow unloading of now-processed workpieces W, W', W" and W'" as described in Workpiece Step 3.

The invention claimed is:

1. An electrochemical deposition system for depositing metal features onto a workpiece at respective target locations of the workpiece, the workpiece having a pattern of target locations, the system comprising:
    a deposition chamber adapted to receive plating solution when in use,
    a workpiece holder for holding the workpiece in a first plane, the workpiece holder being adapted for insertion into and removal from the deposition chamber while holding the workpiece,
    a shield comprising a substantially planar plate having a pattern of apertures formed therein, the pattern of apertures substantially corresponding to the target locations in use,
    a shield holder for holding the shield in a second plane substantially parallel to the first plane, the shield holder being adapted for insertion into and removal from the deposition chamber while holding the shield,
    a positioning mechanism that includes a pivot rotate opener (PRO) that is movable to a plurality of different orientations each aligned with a respective plane, the PRO being arranged and operative to receive the workpiece holder while in a first one of the plurality of different orientations aligned with a first plane,
    the positioning mechanism being arranged to receive a workpiece from storage, and operative to align, with actuators, the workpiece such that the target locations substantially align with the pattern of apertures of the shield while the shield is held by the shield holder during deposition of metal on the target locations in the deposition chamber, the PRO being movable to a second one of the plurality of different orientations aligned with a second plane that is different from the first plane to receive the aligned workpiece within the workpiece holder that is in the PRO, and
    a transporter operative to transport the workpiece holder that holds the aligned workpiece from the PRO to the deposition chamber.
2. The system of claim 1, wherein the electrochemical deposition system further comprises an additional actuator operable to change the relative distance between the workpiece holder and shield holder.
3. The system of claim 2, wherein the additional actuator is operable to change the relative distance between the workpiece holder and shield holder in a direction normal to the first and second planes, while they are located within the deposition chamber.
4. The system of claim 1, wherein at least one of the actuators is operable to change the relative position of the workpiece and workpiece holder in the plane parallel to the workpiece.
5. The system of claim 1, wherein the positioning mechanism comprises a distance sensor capable of measuring the bow of the workpiece.
6. The system of claim 1, wherein the positioning mechanism further includes a transfer arm positioned to receive the workpiece and feed the workpiece to the workpiece holder, wherein the actuators are configured to adjust the relative position of the workpiece with respect to the transfer arm prior to the insertion of the workpiece into the workpiece holder.
7. The system of claim 1, wherein the first plane is a vertical plane plane and the second plane is a horizontal plane.
8. The system of claim 1, wherein the transporter is operative to transport the workpiece holder and the aligned workpiece held by the workpiece holder to a pre-processing module, and operative to transport the workpiece holder and the aligned workpiece held by the workpiece holder from the pre-processing module to the deposition chamber.

* * * * *